(12) United States Patent
Laighton et al.

(10) Patent No.: US 9,584,080 B2
(45) Date of Patent: Feb. 28, 2017

(54) COMPACT MICROWAVE POWER AMPLIFIER CIRCUIT

(71) Applicant: Raytheon Company, Waltham, MA (US)

(72) Inventors: Christopher M. Laighton, Boxborough, MA (US); James A. Robbins, Merrimac, MA (US); Jonathan B. Langille, Boston, MA (US); Philip M. Henault, Medway, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/628,917

(22) Filed: Feb. 23, 2015

(65) Prior Publication Data
US 2016/0248392 A1    Aug. 25, 2016

(51) Int. Cl.
*H03F 3/60*    (2006.01)

(52) U.S. Cl.
CPC ....... *H03F 3/602* (2013.01); *H03F 2200/192* (2013.01); *H03F 2200/198* (2013.01); *H03F 2200/204* (2013.01); *H03F 2200/451* (2013.01)

(58) Field of Classification Search
CPC ......... H03F 1/0288; H03F 1/07; H03F 1/3252
USPC ............................................. 330/295, 124 R
See application file for complete search history.

(56) References Cited

U.S. PATENT DOCUMENTS

| 4,185,258 | A | 1/1980 | Cote et al. | |
|---|---|---|---|---|
| 5,430,411 | A * | 7/1995 | Boulic | H03G 3/3042 330/124 R |
| 6,437,661 | B2 | 8/2002 | Nishimura et al. | |
| 6,822,532 | B2 | 11/2004 | Kane et al. | |
| 6,922,106 | B2 * | 7/2005 | Lautzenhiser | H03F 3/601 330/286 |
| 8,947,160 | B2 * | 2/2015 | Ding | H01P 5/186 330/147 |
| 9,225,291 | B2 * | 12/2015 | Ahmed | H03F 1/0233 |
| 9,419,566 | B2 * | 8/2016 | Noori | H03F 1/0288 |

FOREIGN PATENT DOCUMENTS

EP    1 139 487 A1    10/2001

* cited by examiner

*Primary Examiner* — Henry Choe
(74) *Attorney, Agent, or Firm* — Daly, Crowley, Mofford & Durkee, LLP

(57) ABSTRACT

A power amplifier structure having: a power divider for dividing power in a signal fed to an input port between a pair of output ports. Each one of a pair of amplifiers has: an input coupled to a corresponding one of the pair of power divider output ports; and an output. A power combiner is provided. Signals at the power divider output ports are fed to the inputs of the pair of amplifiers in a forward direction and then pass through the amplifiers in the forward direction towards the outputs of the pair of amplifiers. Connectors direct the signals at the amplifier outputs to the power combiners, the signal then passing through the power combiner to an output port in a direction opposite to the forward direction.

9 Claims, 14 Drawing Sheets

COMPACT MICROWAVE POWER AMPLIFIER CIRCUIT

TECHNICAL FIELD

This disclosure relates generally to microwave power amplifier circuits and more particularly to compact microwave power amplifier circuits.

BACKGROUND

As is known in the art, microwave power amplifiers, such as, for example, GaAs Monolithic Microwave Integrated Circuit (MMIC) amplifiers, are used in a wide variety of applications. In one application, an input microwave signal is split, or divide, using a power splitter, herein after sometimes also referred to herein as a power divider, into two quadrature paths, each path is fed a different amplifier, after power amplification in the amplifiers, the amplifier outputs are recombined in quadrature using a power combiner into a single output signal. There are many types of power dividers and combiners. One of the most popular versions for these applications is a Lange splitter/combiner. The Lange requires tight spacing between signal traces and therefore requires a high technology board fabrication. Often, the splitter/combiner function is actually a separate part and therefore requires interconnects that can drive cost based on assembly yield. An example of two amplifiers that are split and combined using a Lange combiner is shown in FIGS. 1 and 2. All power amplifiers are limited ultimately by the amount of FET periphery that can be reliably fabricated onto one MMIC. This limitation is a balance of thermal considerations and yield. To overcome this issue, power combiners are sometimes used to combine multiple power amplifiers in order to increase the total output power of a unit amplifier (two MMIC amplifier) cell.

There are many different configurations of power combiners and trade-offs to each one. The design trade-offs could be power handling, bandwidth, physical constraints, etc. . . . . The most popular form of power combining power amplifier MMICs is called quadrature combining. The quadrature splitter/combiner arrangement, shown in FIGS. 1 and 2, is used to properly phase combine the overall signal. The input signal is split, as noted above, while delaying one of the power amplifier inputs by 90 degrees (in quadrature). When the signals are re-combined at the output of the power amplifiers, the other signal is delayed by 90 degrees so that both signals combine in phase. This maximizes the overall power combined. The quadrature combiner also has the benefit that any mismatch signal that comes from the power amplifier being terminated in the $4^{th}$, or isolation, port, as shown in FIGS. 1 and 2. This is particularly important so that the power amplifier does not load pull the amplifier that drives the input signal. This ultimately helps maximize the total combined output power of the channel.

There are many types of quadrature dividers and combiners including Lange, branch line and overlay, such as, for example, described in U.S. Pat. Nos. 4,185,258 and 6,437,661 where an upper and lower overlaying conductors in regions $R_1$ and $R_2$ as shown in FIG. 2. They are all 4 port devices, where the $4^{th}$ port is the isolation port. The Lange and branch line combiners are planar combiners, while the overlay is a 3-dimensional layout technique. Lange combiners have very good performance but can be expensive due to the high cost of board fabrication due to tight line to line spacing. Branch line combiners are also used extensively in power amplifier MMIC combining but are often physically large planar structures with very little design flexibility. Overlay combiners are rarely used for power amplifier combining but add the potential for 3-dimensional integration.

In power amplifier combining, cost and size are important considerations to the transmit/receive module designer. The Lange design often is fabricated as separate placeable components due to the cost if the yield of the combiner drives the yield of an overall integrated board. As a component, the Lange drives cost as a separate part as well as adding manufacturing yield issues due to component placement and wire bond interconnect issues. The branch line combiner in itself is fairly low cost technology but is very cumbersome in size which ultimately limits design flexibility and increases overall cost due to overall board size. Overlay combiners can be made in commercial quality boards and can decrease the amount of real estate needed but often have minimal size improvement due to underutilization of the full 3-dimensional capability.

Combining of power amplifier MMICs using quadrature combiners is an established practice within the industry using Lange, branch line and overlay combiners. Some characteristics of Lange couplers are: High technology, high cost boards required for line to line spacing; The yield of this function often drives it to be a separate part which is prone to higher cost and yield fallout due to component placement and interconnect issues; Planar structure uses a lot of space in the x-y plane. Some characteristics of branch line couplers are: Large structure that takes up a lot of space in the x-y plane; very little design flexibility to allow for compact layout. Overlay coupler Industry practice does not fully utilize the z-dimension for compact design

SUMMARY

In accordance with the present disclosure, a power amplifier structure is provided having: a power divider for dividing power in a signal fed to an input port of the power divider between a pair of output ports of the power divider; a pair of amplifiers, each one of the pair of amplifiers having: an amplifier input coupled to a corresponding one of the pair of output ports of the input power divider; and an amplifier output; and a power combiner having: a pair of power combiner input ports and a power combiner output port coupled to the pair of power combiner input ports for combining power in a signal at the pair of power combiner input ports to the power combiner output port. Signals at the power divider output ports are fed to the amplifier input of the pair of amplifiers in a forward direction and then pass through the amplifiers in the forward direction towards the amplifier output of the pair of amplifiers. Connectors are provided for directing the signals at the output of the pair of amplifiers to the pair of power combiner input ports, the signal then passing through the power combiner to the power combiner output port in a direction opposite to the forward direction.

In one embodiment, the output ports of the power divider and the output port of the power combiner are disposed in a region on an input port side of the amplifiers and the pair of input port of the power combiner is disposed on a region on an opposing output port side of the amplifiers. In one embodiment, the power combiner has a coupling region disposed between the pair of input ports and the output port. The coupling region is vertically disposed over portions of at least one of the pair of amplifiers.

In one embodiment, the coupling region and portions of one of the pair of amplifiers are disposed directly over each other.

In one embodiment, the coupling region comprises a pair of vertically overlying conductors separated by a dielectric.

In one embodiment, the output port of the power combiner is disposed between the pair of output ports of the power divider and the pair of input ports of the power combiner.

In one embodiment, the output port of the power combiner and the pair of amplifiers are disposed at different levels in the structure.

In one embodiment, the connectors "fold" the outputs of the amplifiers disposed on one level back "over" the amplifiers to the power combiner on a different level.

With such "fold over" arrangement, the same area in the x-y plane is used for both combining and placement of the amplifiers.

Thus, the disclosure uses a multilayer substrate where the top side is the RF input and output to the structure, the middle layers are used for power splitting and power combining, and the bottom layer is used to mount a flip chip MMIC. The whole structure then sits on a thermal pad or heat sink that butts up to the backside of the flip chip MMIC. This vertical integration and incorporation of a "fold-over" design greatly reduces the x-y footprint required to combine the power amplifiers. Thus, the disclosure vertical integrates going down vertically through a power splitter and continuing through to the power amplifiers on the backside of a board. Then coming out of the amplifiers and vertically combining and coming back to the top surface. This, "fold-over" design greatly reduces the x-y footprint of the amplifier structure. This improved splitting/combining concept implements 3-dimensional board design/technology as well as a 'fold-over' technique that allows for a compact design and low cost. The arrangement utilizes low cost commercial boards. The multi-layer board allows for vertical integration in the z-dimension. The signal is vertically transported down to intermediate layers where the coupling that enables the splitting of the signal occurs. The signal then transports vertically to the back of the board where it makes direct connection with flip-chip power amplifier MMICs. At the output of the power amplifier the signal is vertically transported to a combiner in the intermediate layers where the signals are vertically combined through coupling. The signal then is vertically transported back to the top of the board. The use of this vertical signal transportation has a direct impact on keeping the x-y size very small. Thus, a smaller size is achieved with this 'fold-over' arrangement. The power combiner is effectively "folded over" back towards the input power divider. This is similar to folding a paper in half. This allows full integration and utilization of the 3-dimensional aspect of the overlay combiner. The fold-over allows for a dramatic size reduction in the x-y plane. This arrangement allows for: a small amplifier structure footprint in the x-y plane that is low cost and maintains the high performance of the power amplifiers; the multi-layer board enabled vertical transmission; Intermediate layers enable coupling for splitting/combining; the Flip-chip MMICs are attached to the bottom of the board with direct connections from intermediate layers; the backside of MMIC rests on a thermal pad or heat sink to allow for heat dissipation path; the Multi-layer board enabled vertical transmission; the intermediate layers enable coupling for splitting/combining; the Flip-chip MMICs attached to the bottom of the board with direct connections from intermediate layers; and the backside of MMIC rests on a thermal pad or heat sink to allow for heat dissipation path;

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
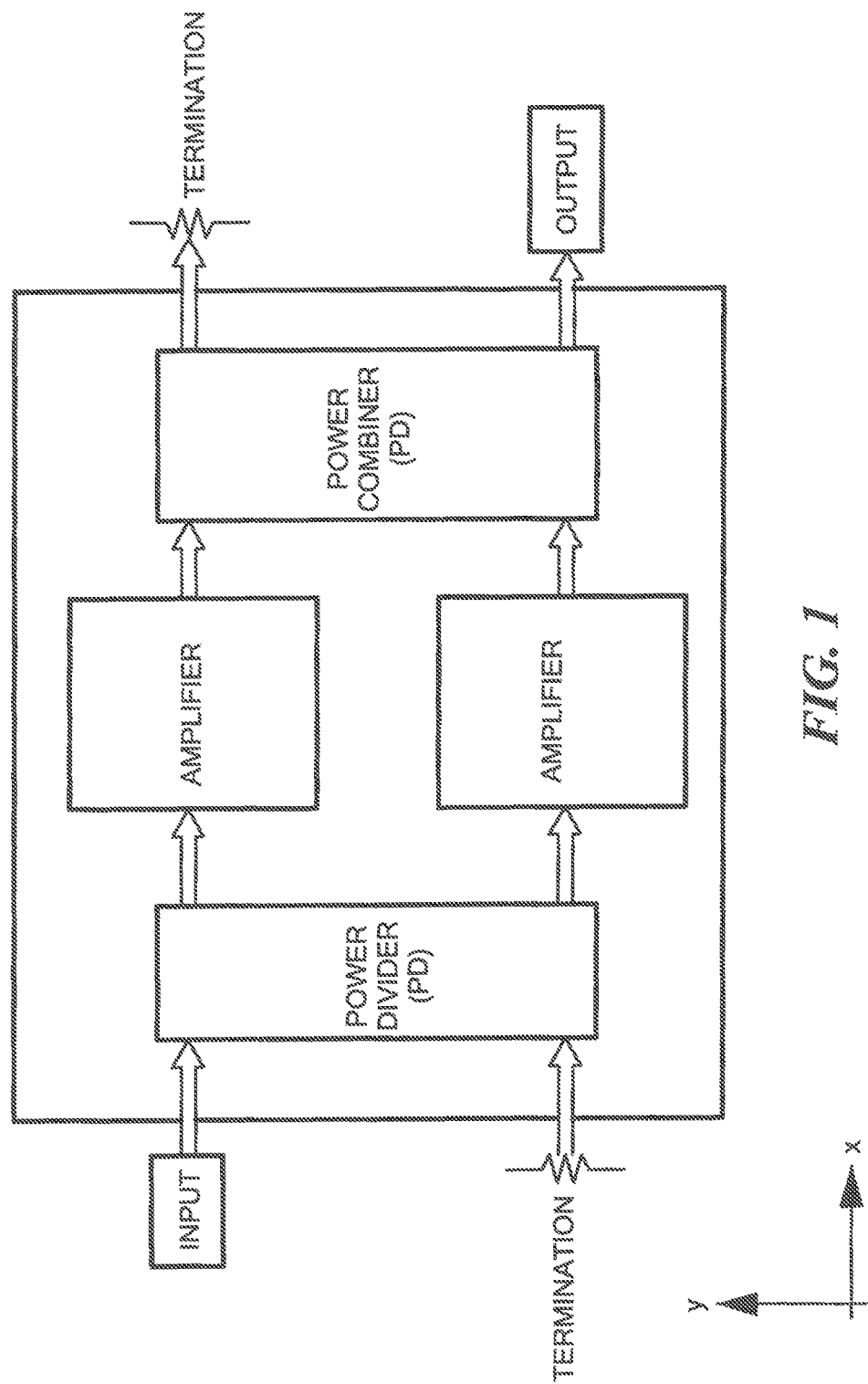
FIG. 1 is a block diagram of an amplifier structure according to the PRIOR ART.
Figure 2:
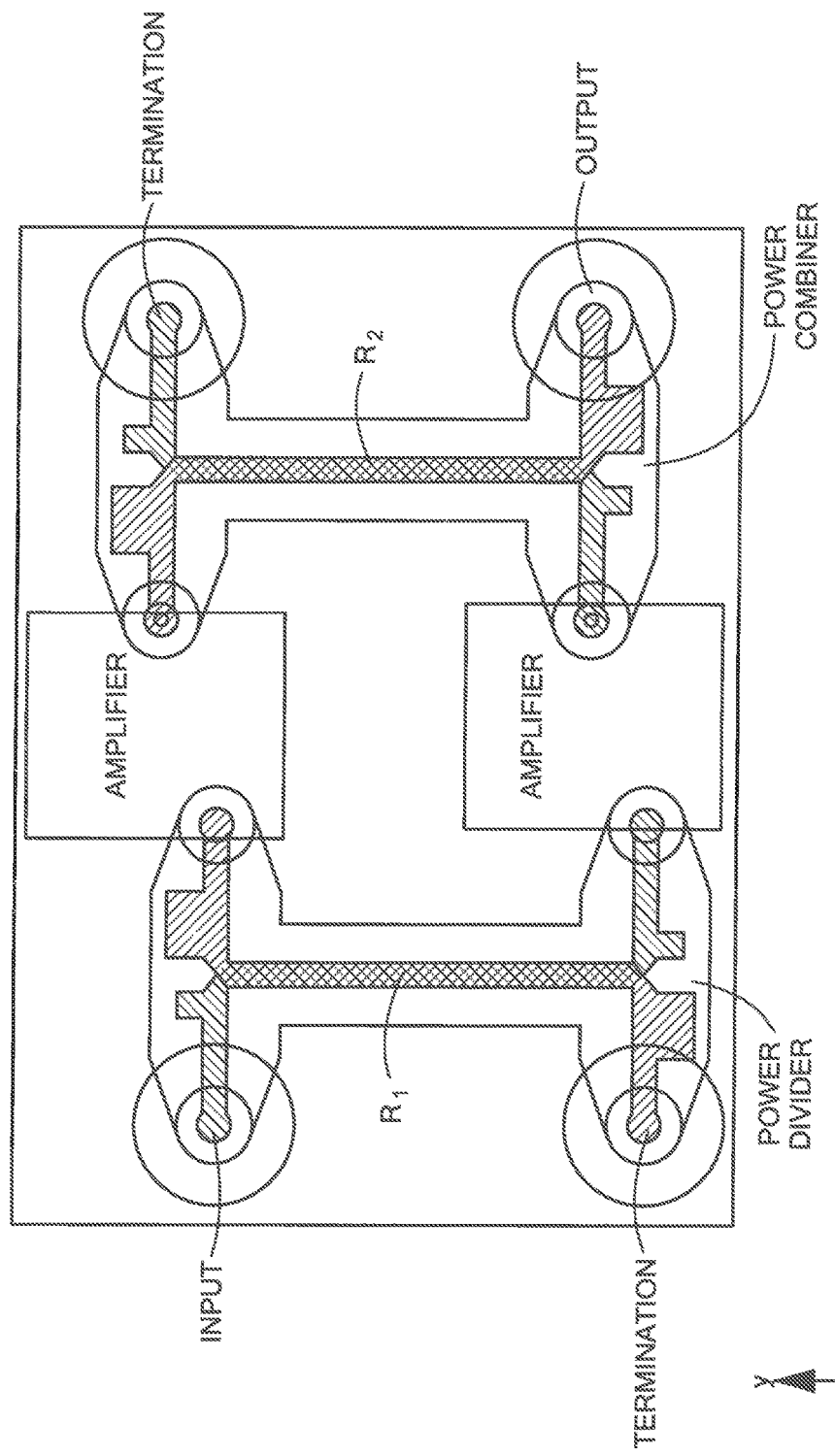
FIG. 2 is a diagrammatical top view of the amplifier structure of FIG. 1 according to the PRIOR ART.
Figure 3:
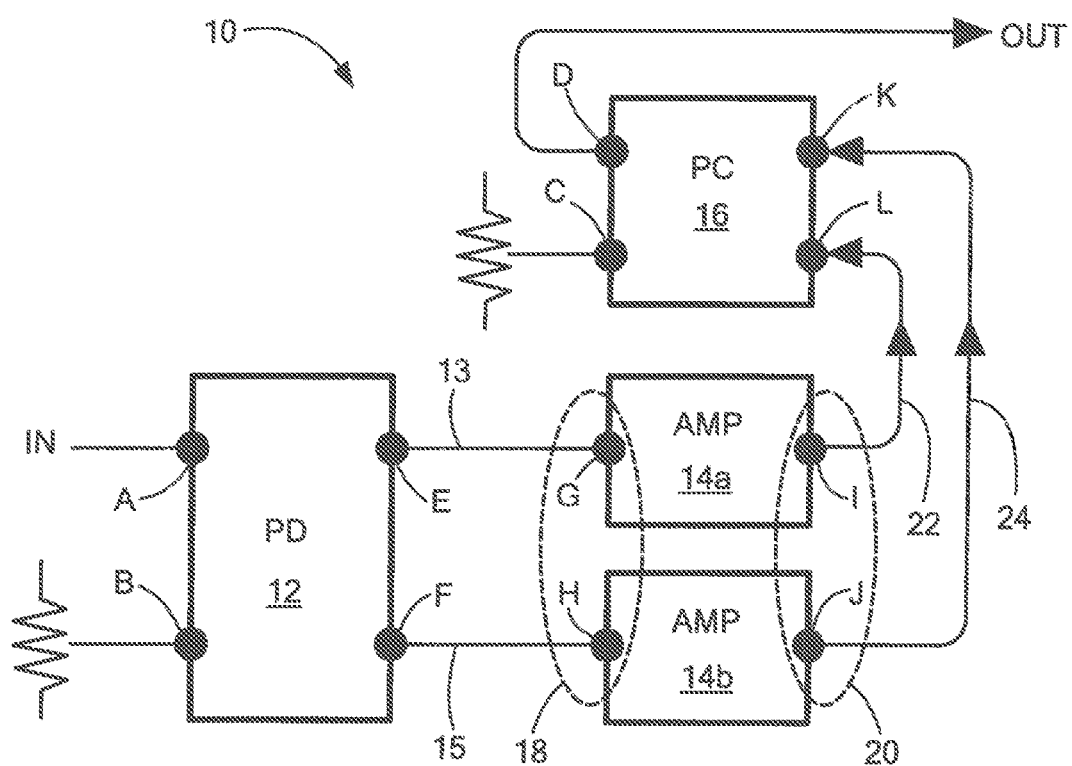
FIG. 3 is a schematic diagram of an amplifier structure according to the disclosure.

Referring now to FIG. 3, a power amplifier structure 10 is shown, having a power divider (PD) 12, a pair of amplifiers 14a, 14b, here Monolithic Microwave Integrated Circuit (MMIC) amplifiers, and a power combiner (PC) 16, all arranged as shown for power amplifying an input signal fed to port A, the power amplified signal being produced at port D. The power divider 12 and the power combiner are a quadrature power divider and a quadrature combiner 16, respectively and hence power divider 12 has a termination port B and power combiner 16 has a termination port C, as shown.

Figure 4:
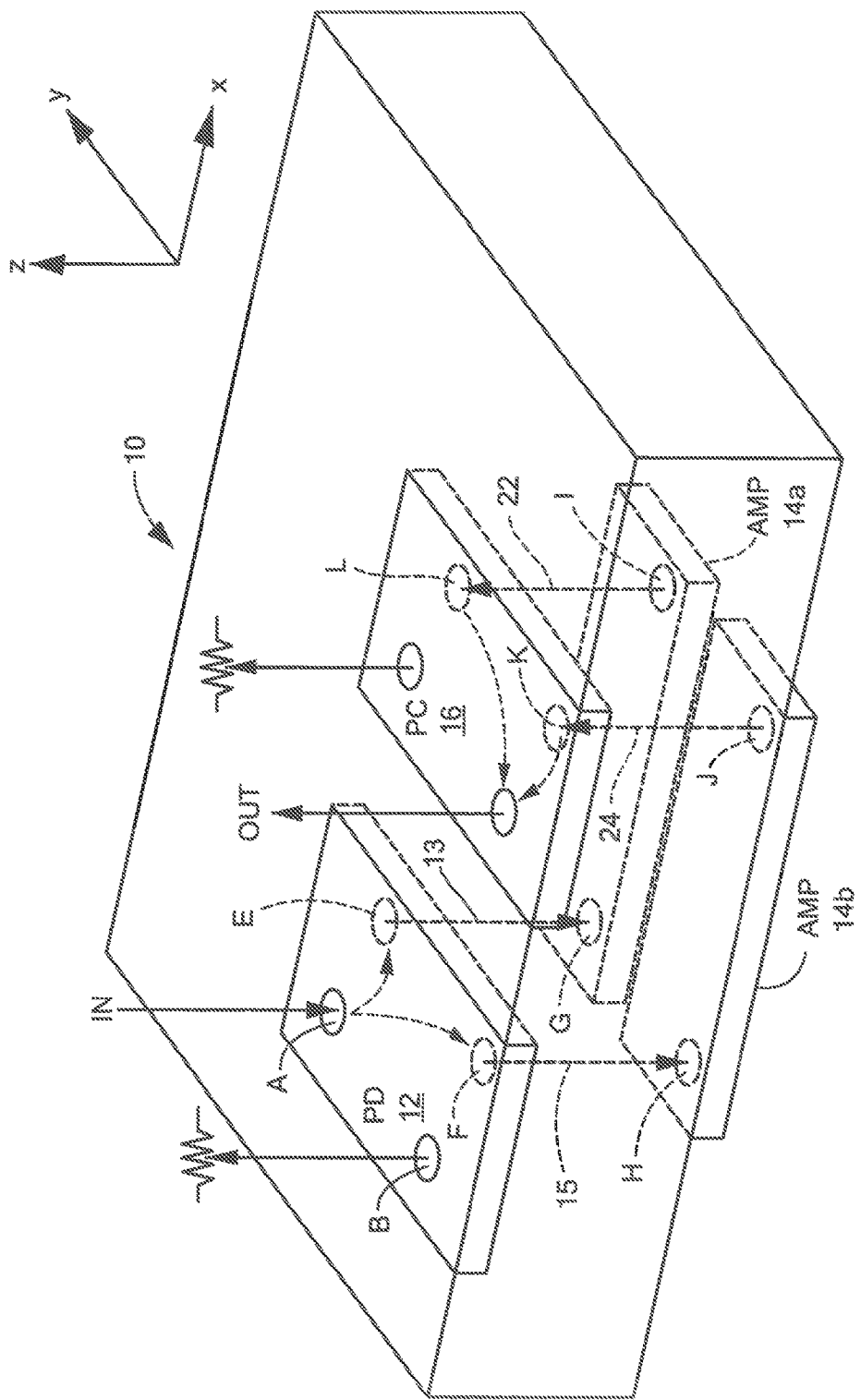
FIG. 4 is a diagrammatical, perspective, view of the amplifier structure of FIG. 3 according to the disclosure.

More particularly, the power divider 12 is a quadrature power divider, here an overlay quadrature power divider, having an input port A fed by a microwave input signal; a termination port B; and a pair of output ports E and F, as shown. Each one of the power amplifiers 14a, 14b has an input port G and H, respectively, connected to a corresponding one of the pair of output ports E and F, respectively, with connectors 13, 15, respectively as shown. Each one of the power amplifiers 14a, 14b has an output port I and J, respectively. The power combiner 16 is a quadrature power combiner, here an overlay quadrature power combiner, having an input port L fed by the power amplified signal at port I of power amplifier 14a, and an input port K fed by the power amplified signal at port J of power amplifier 14b, as shown. It is noted that the output ports C and D of the power combiner 16 are disposed over an input port side or region 18 of the amplifiers 14a, 14b and the input ports L and M of the power combiner 16 are disposed over an opposing output port side or region 20 of the amplifiers 14a, 14b, with connectors 22, 24 provided for directing power at the output ports I and J along a direction outward from the output region 20 backwards towards the input region 18 of the amplifiers 14a, 14b. Thus, signals at the output ports E and F of the power divider 12 are fed to the input ports G and H of the pair of amplifiers 14a, 14b in a forward direction (shown in FIG. 3 ad left to right) and then pass through the amplifiers 14a. 14b in the forward direction to the output ports I and J of the amplifiers 14a, 14b. Connectors 22, 24 are provided for directing the signals at the output ports I and J of the amplifiers 14a, 14b to the pair of input ports L and K of the power combiner 16, the signal then passing through the power combiner 16 to the output port D of the power combiner 16 in a direction opposite to the forward direction (shown in FIG. 3 as being left to right). Ports B and C are connected to conventional terminations, as indicated. As will be described in more detail below, and referring also to FIGS. 4 and 5, it is noted that here the power amplifier structure 10 is formed as a three dimension structure (along the X, Y and Z axis), as shown. More particularly, the power divider 12 and the power combiner 16 are in an upper section of the structure 10 and the amplifiers 14a, 14b are flip-chip mounted to the bottom of the structure 10, with the connectors 13, and 15 being vertical via passing in a direction parallel to the Z axis, as shown. Thus, the power divider 12 and the power combiner 16 are in different levels of the structure 10. The bottom of the amplifiers 14a, 14b may be mounted to a heat sink, shown in FIG. 12.

Figure 5:
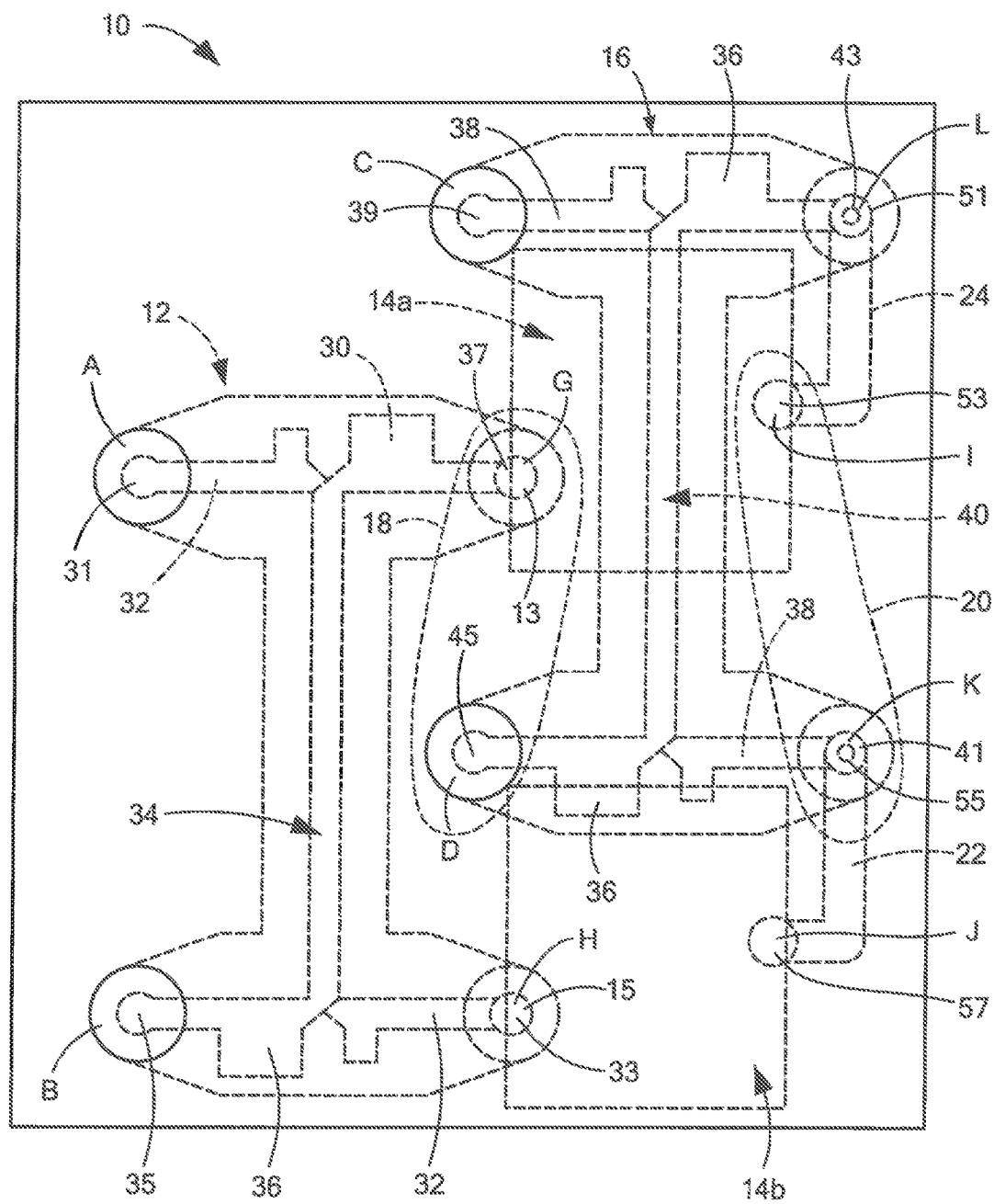
FIG. 5 is a plan view of the amplifier structure of FIG. 3 according to the disclosure.

As noted above, the power divider 12 here an overlay quadrature power divider having an upper conductor portion 30 and a lower conductor portion 32, as shown in FIG. 5. The upper conductor portion 30 and the lower conductor portion 32 overlay one another and are vertically separated one from the other by a portion of dielectric material, layer 80 in FIGS. 11A and 11B, to be described, in a coupling region 34. Likewise, the power combiner 16 is here also an overlay quadrature power combiner having an upper conductor portion 36 and a lower conductor portion 38, as shown in FIG. 5. The upper conductor portion 36 and the lower conductor portion 38 overlay one another and a vertically separated by a different portion of the above-mentioned dielectric, to be described, in a coupling region 40. It is noted that the coupling region 40 is vertically disposed over amplifier 14a.

It is noted that one end 31 of the lower conductor portion 32 of power divider 12 is connected to port A and the opposite end 33 of the lower conductor portion 32 of power divider 12 provides output F of the power divider 12 and is connected to input port H of amplifier 14b through vertical via 15. One end 35 of the upper conductor portion 30 of power divider 12 is connected to termination port B and the opposite end 37 of the upper conductor portion 30 of power divider 12 provides output E of the power divider 12 and is connected to input port G of amplifier 14a through via 13.

One end 39 of the lower conductor portion 38 of power combiner 16 is connected to termination port C and the opposite end 41 of the lower conductor portion 38 of the power combiner 16 is connected to output J of amplifier 14b through connector 22. One end 43 of the upper conductor portion 36 of power combiner 16 is connected to output I of amplifier 14a through connector 24 and the opposite end 45 of the upper conductor portion 36 of power combiner 16 provides output port D of the power combiner 16.

It is noted that the output ports G and H of the power divider 12 and the output ports C and D of the power combiner 16 are disposed on the input port side 18 of the amplifiers 14a, 14b. More particularly, the output ports G and H of the power divider 12 and the output ports C and D of the power combiner 16 are disposed on the input port side 18 of the amplifiers 14a, 14b and the input ports I and J of the power combiner 16 are disposed on the output port side 20 of the amplifier 14a, 14b, the input port side 18 and the output port side 20 being on opposite sides of the amplifiers 14a, 14b. Thus, a signal at the output ports G and H of the power divider 12 is fed to the input port side 18, i.e., the side of input ports G and H, of the amplifiers 14a, 14b passes in a forward direction to the input ports I and J of the power combiner 16, disposed on an opposing output port side of the amplifiers 14a, 14b, is the signal is then directed by the connectors 22, 24 initially along a direction outward from the output port side 20 of the amplifiers 14a, 14b and then upwardly to the input ports K and L of the power combiner 16, and then signal then passes through the power combiner 16 in a backwards direction opposite to the forward direction towards the output ports C and D of the power combiner 16.

Figure 6:
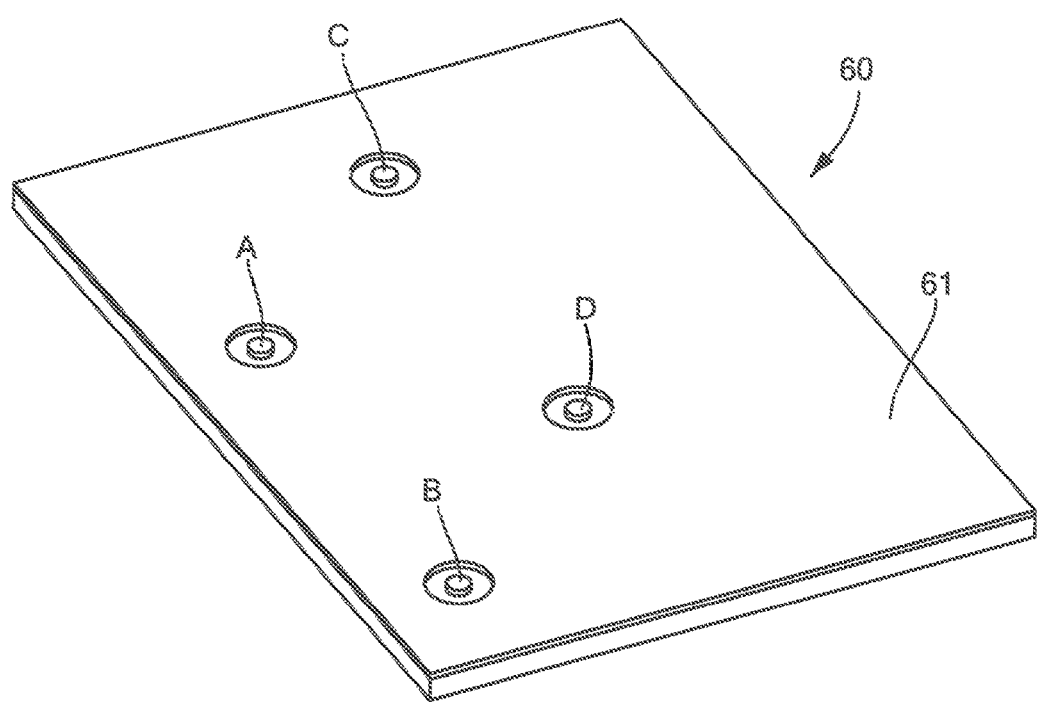
FIG. 6 is a perspective view of the top surface of one of a plurality of printed circuit boards used in the amplifier structure of FIG. 3 according to the disclosure.
Figure 7A:
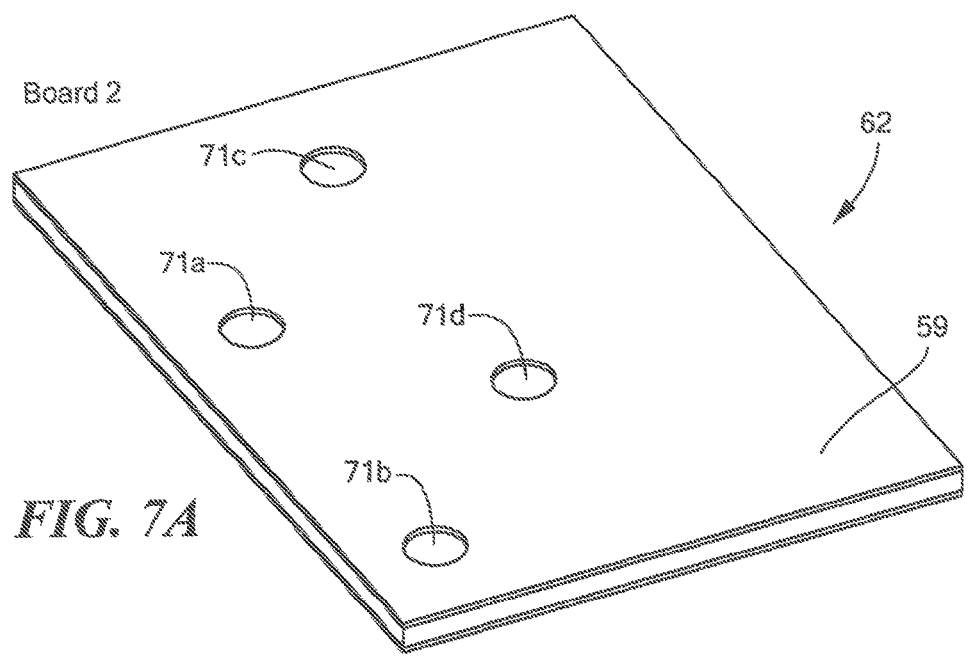
FIG. 7A is a perspective view of the top surface of a second one of a plurality of printed circuit boards used in the amplifier structure of FIG. 3 according to the disclosure.
Figure 7B:
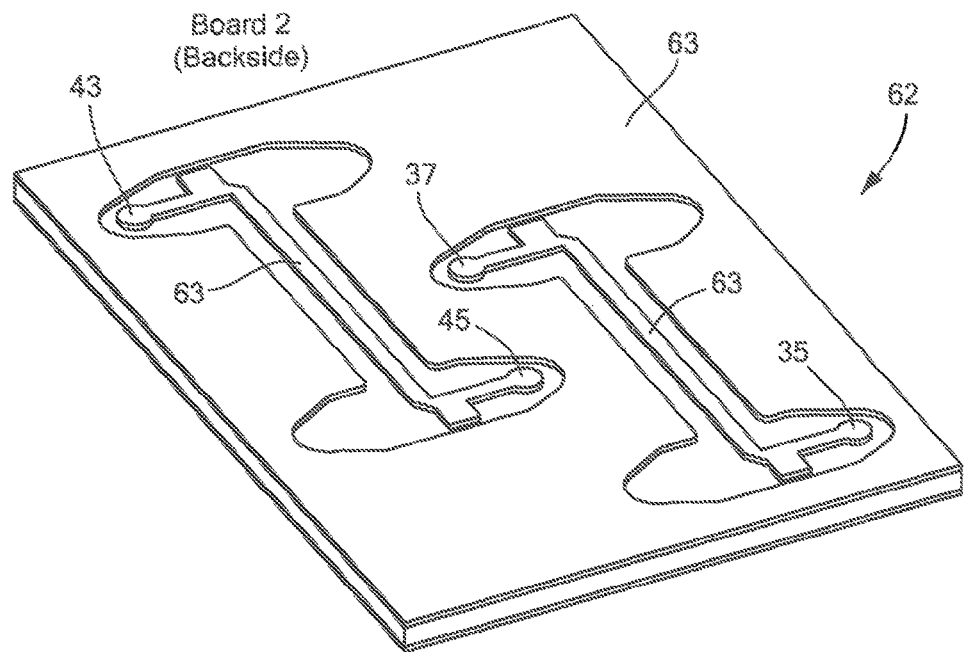
FIG. 7B is a perspective view of a bottom surface of the second one of a plurality of printed circuit boards used in the amplifier structure of FIG. 3 according to the disclosure.
Figure 8:
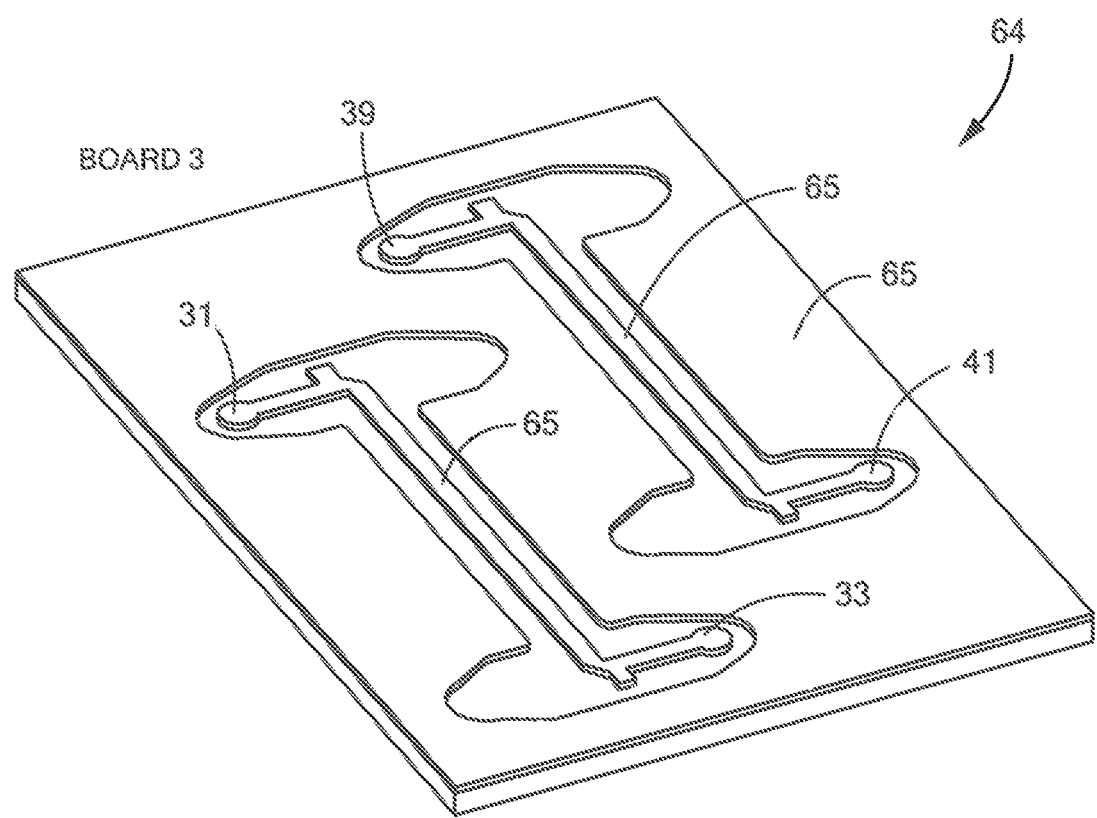
FIG. 8 is a perspective view of a top surface of a third one of a plurality of printed circuit boards used in the amplifier structure of FIG. 3 according to the disclosure.
Figure 9A:
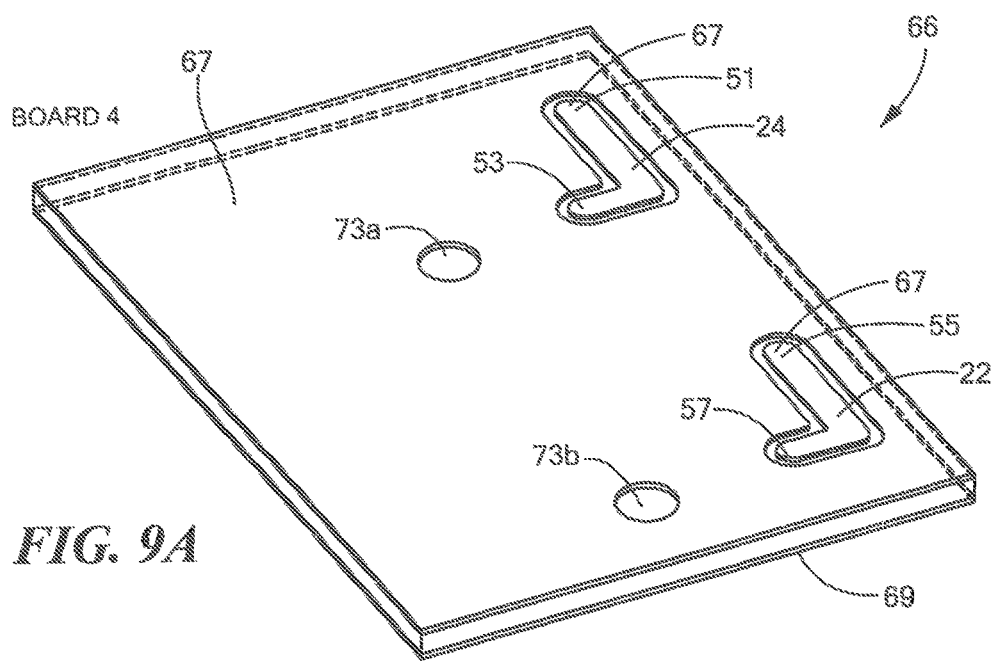
FIG. 9A is a perspective view of the top surface of a fourth one of a plurality of printed circuit boards used in the amplifier structure of FIG. 3 according to the disclosure.
Figure 9B:
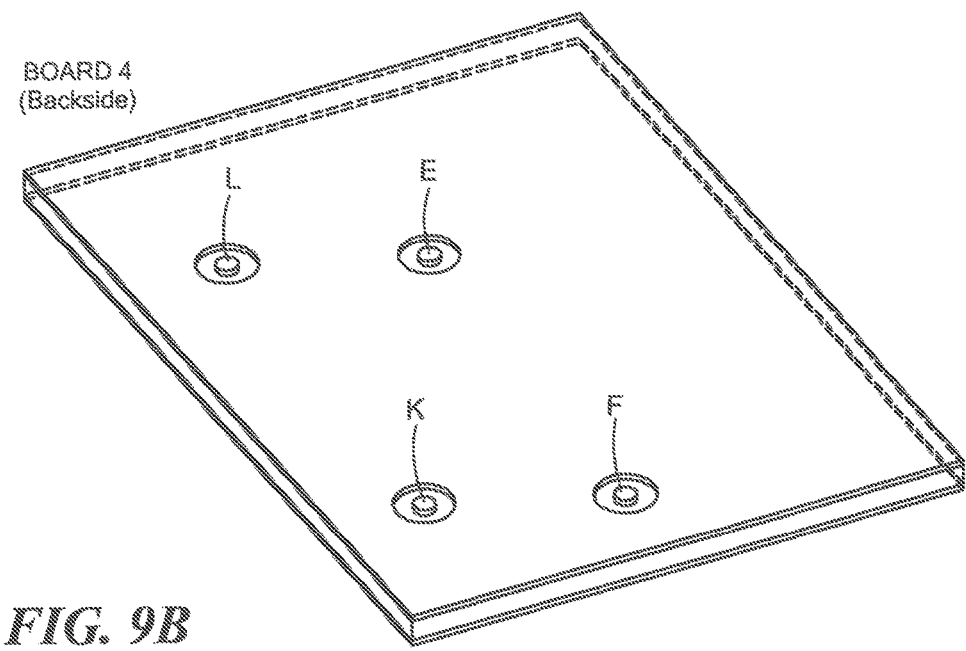
FIG. 9B is a perspective view of a bottom surface of the fourth one of a plurality of printed circuit boards used in the amplifier structure of FIG. 3 according to the disclosure.

It is noted that the structure 10 includes four printed circuit boards: a metal layer 61 on the upper surface of a first dielectric printed circuit board 60 being shown in FIG. 6 (the bottom surface of board 60 having no metal layer); an upper metal layer 59 and bottom metal layer 63 of a second dielectric printed circuit board 62 being shown in FIGS. 7A and 7B, respectively, a metal layer 65 on the upper surface of a third dielectric printed circuit board 64 being shown in FIG. 8 (the bottom surface of board 64 having no metal layer); and, an upper metal layer 67 and bottom metal layer 69 of a fourth dielectric printed circuit board 66 being shown in FIGS. 9A and 9B, respectively.

It is first noted that the metal layer 61 (FIG. 6) of board 60 provides the ports A, B, C and D along with ground planes. The bottom surface of board 60 has no metal layer.

It is next noted that the metal layer 59 on the upper surface of board 62 (FIG. 7A) also provides a ground plane portion, and has apertures 71a-71d, formed in the metal layer 59 as shown, for reasons to become apparent. The metal layer 63 (FIG. 7B) on the bottom of board 62 includes, in addition to ground plane portions, the upper conductive portions 30 and 36 (FIG. 5) of the power divider 12 and power combiner 16, respectively. The first and second boards 60 and 62 are bonded together in any conventional manner, as with non-conductive epoxy, not shown, for example, to form a first assembly 70, FIGS. 10 and 11A.

It is noted that conductive vias are formed, as indicated by vertical dotted lines in FIG. 10, as follows: a conductive via between port D and end 45; a conductive via between port B and end 34.

It is next noted that the metal layer 65 (FIG. 8) on the upper surface of a third dielectric printed circuit board 64 includes, in addition to ground plane portions the lower conductive portions 32 and 38 (FIG. 5) of the power divider 12 and power combiner 16, respectively. There is no metal layer on the bottom of the third board 64.

The upper surface (FIG. 9A) of a fourth dielectric printed circuit board 66 has a metal layer 67 providing ground plane portions and having a pair of apertures 73a, 73b formed therein and has also formed therein the connectors 22 and 24 (FIG. 5). Connector 22 has ends 55 and 57 and connector 24 has ends 51 and 53, as shown. The metal layer 69 (FIG. 9BG) on the bottom surface of board 66 provides ground plane portion and in addition ports E and F (to connect to the input ports G and H, respectively, of amplifier 14a, 14b, respectively) for the power divider 12 and ports L and K (to connect to the output ports I and J, respectively, of amplifier 14a, 14b, respectively) for combiner 16.

Figure 10A:
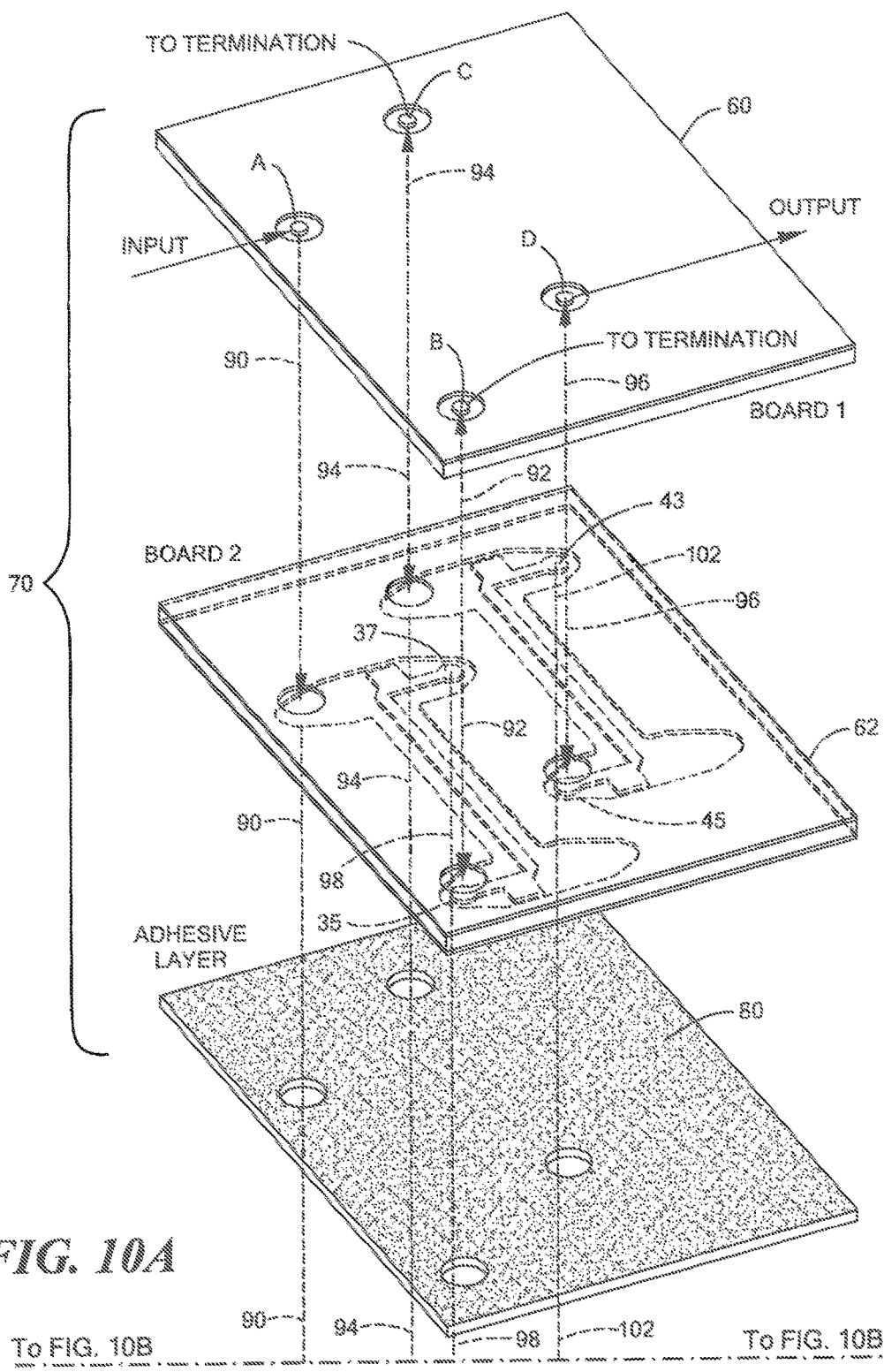
FIGS. 10A and 10B together are a perspective, exploded view of the amplifier structure of FIG. 3 according to the disclosure.
Figure 10B:
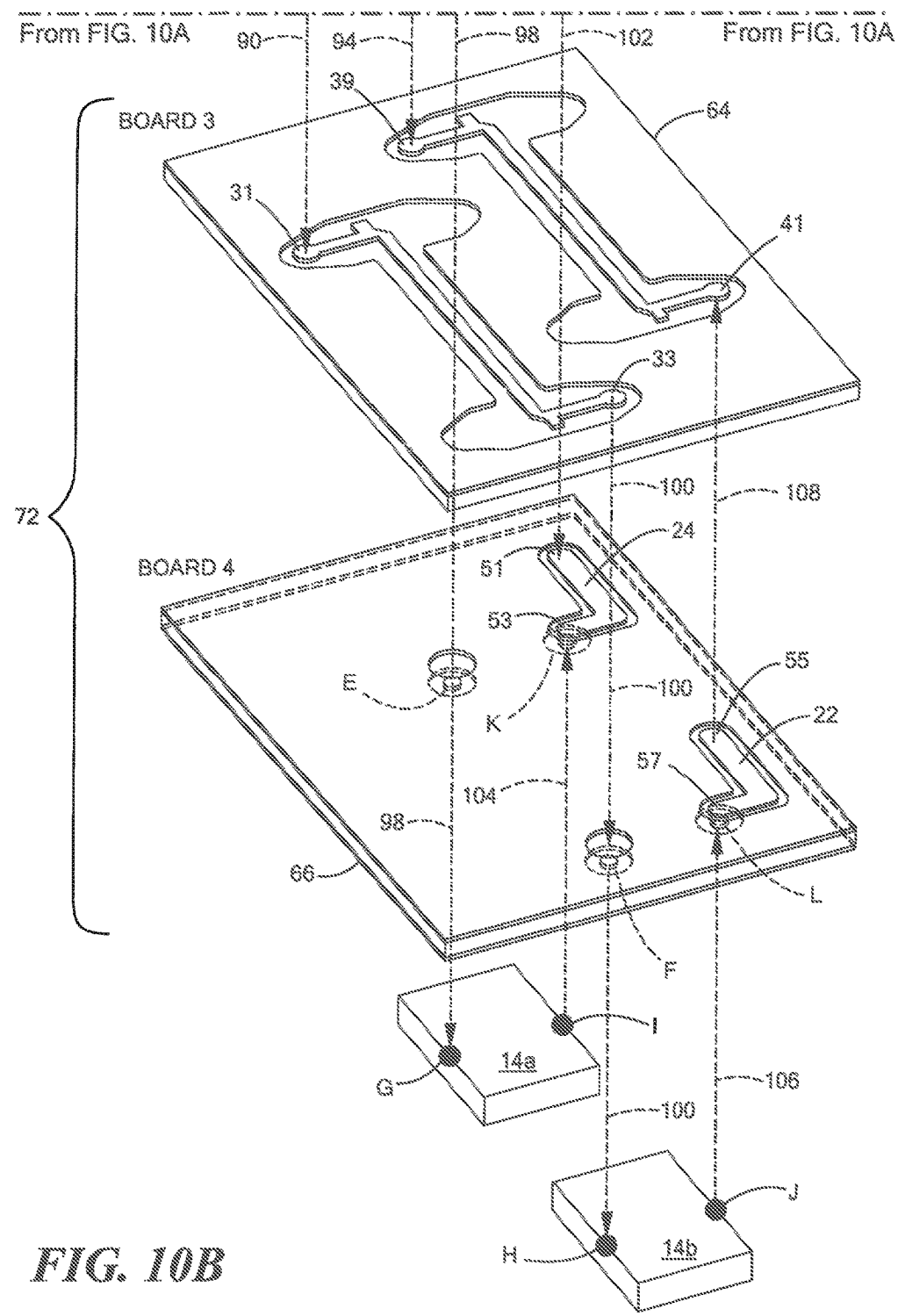
Figure 11A:
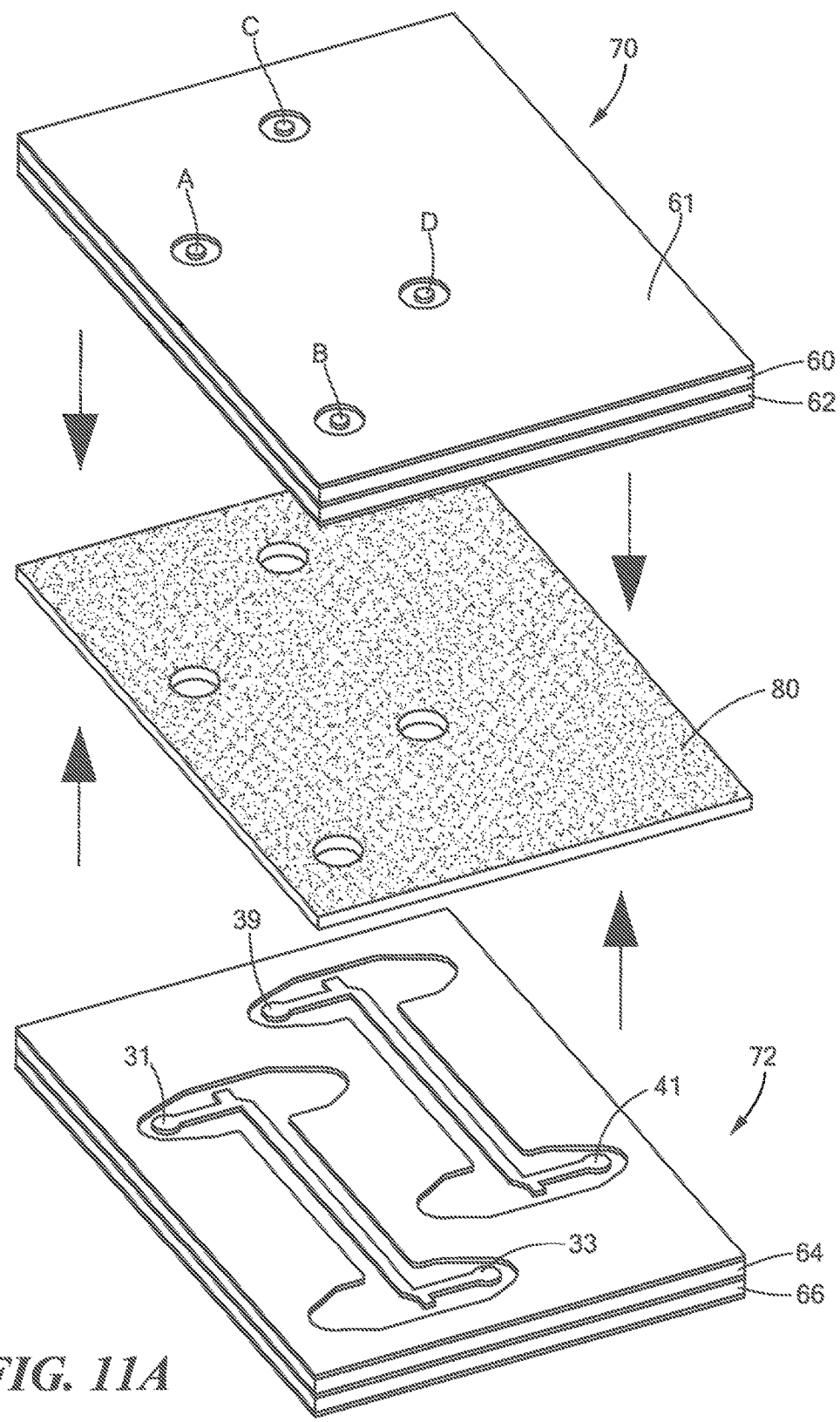
FIG. 11A is a perspective, exploded view illustrating the assembling of the printed circuit boards of FIGS. 6, 7A-7B, 8 and 9A-9B of the amplifier structure of FIG. 3 according to the disclosure.
Figure 11B:
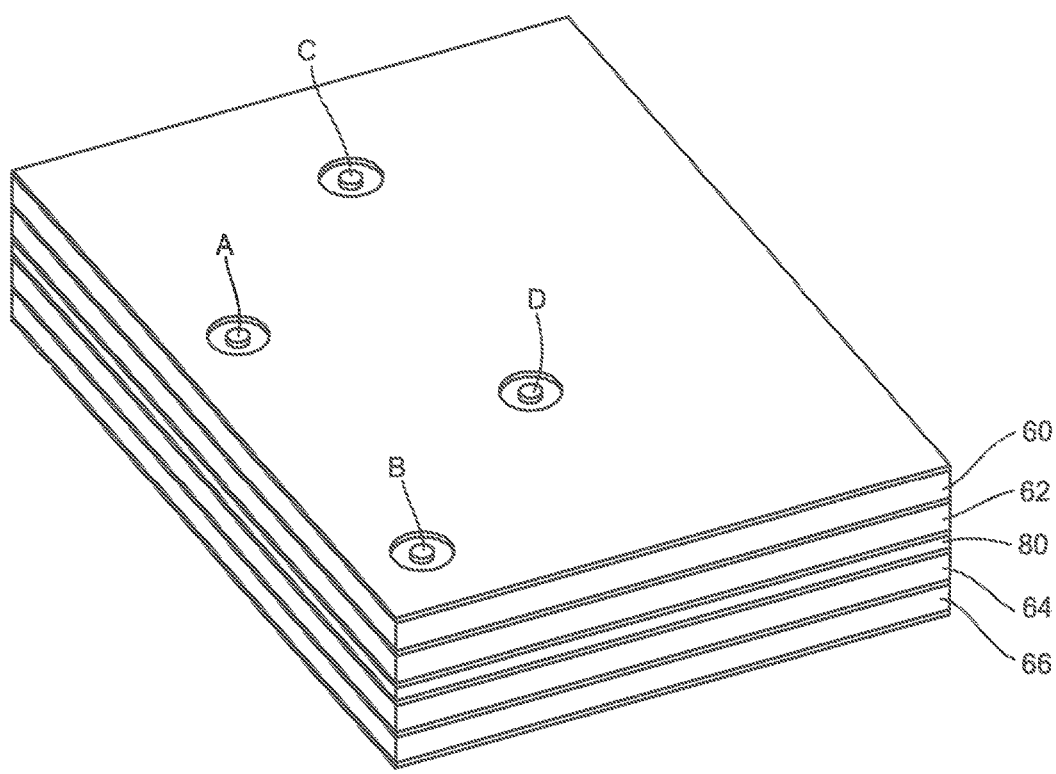
FIG. 11B is a perspective view of the assembled amplifier structure of FIG. 3.

The third and fourth boards 64 and 66 are bonded together in any conventional manner, as with non-conductive epoxy, not shown, for example, to form a second assembly 72, FIGS. 10 and 11A.

After assembling boards 64 and 66, conductive vias are formed, as indicated by vertical dotted lines in FIG. 10, as follows: a conductive via between port F and end 33 of power divider 12; a conductive via between port L and end 57 of connector 22; a conductive via between port K and end 53 of connector 24, and a via between end 55 of connector 24 and end 41 of the power combiner 16. The bottom surface of the first assembly 70 is bonded to the upper surface of the second assembly 72 with a thin layer of dielectric epoxy 80, FIGS. 11A and 11B. The dielectric epoxy provides the dielectric material between the upper conductor portion 30 (FIG. 5) and the lower conductor portion 32 in region 34 described above in connection with FIG. 5.

After bonding the first assembly and the second assembly and remaining conductive vias required are formed a process which includes drilling through the dielectric epoxy layer 80 and platting with a conductive metal.

A summary of the via connections is:

Via 90 connecting port A to end 31;
Via 92 connecting port B to end 35;
Via 94 connecting port C to end 39;
Via 96 connecting port D to end 45;
Via 98 connecting port G to end 37;
Via 100 connecting port H to end 33;
Via 102 connecting end 51 to end 43;
Via 104 connecting port I to end 53;
Via 106 connecting port J to end 57; and
Via 108 connecting end 41 to end 55.

Thus, the connectors 22, (together with vertical vias 106 and 108) and 24 (together with vertical vias 102 and 104) are arranged to "fold" the outputs of the amplifiers 14a, 14b disposed on one level back "over" the amplifiers to the power combiner on a different level. With such "fold over" arrangement, the same area in the x-y plane is used for both combining and placement of the amplifiers.

Figure 12:
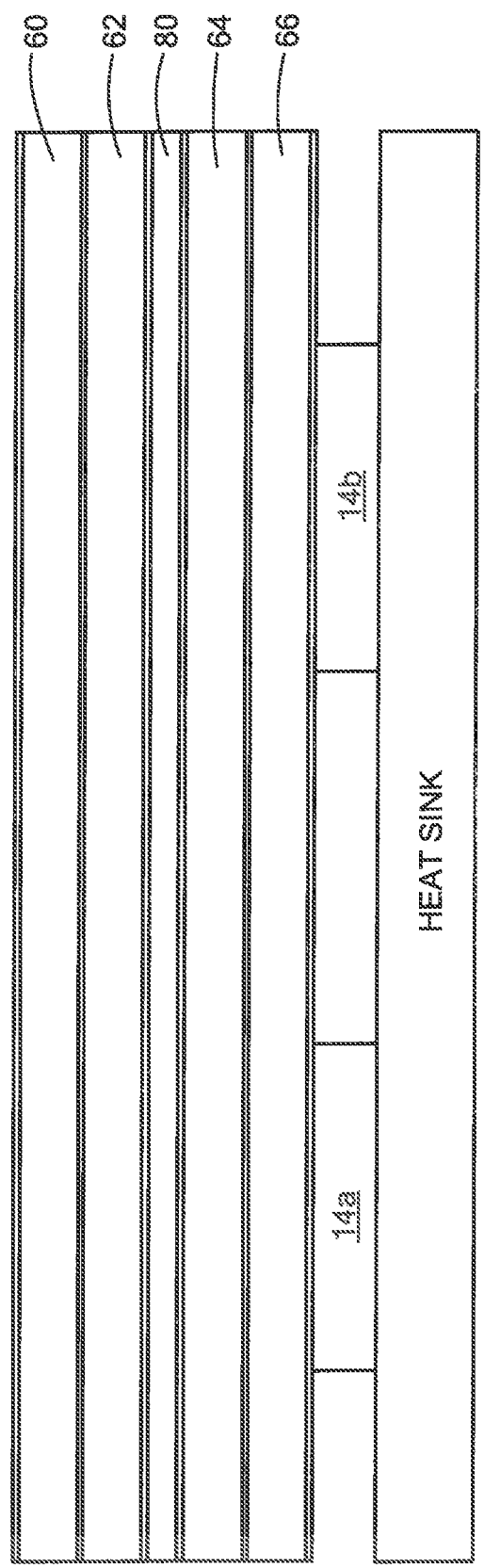
FIG. 12 is a side elevation view of the amplifier structure of FIG. 3 according to the disclosure.

Referring now to FIG. 12, the power amplifier structure 10 is shown with the back sides of the amplifiers 14a, 14b mounted to a heat sink.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A power amplifier structure, comprising:
a power divider for dividing power in a signal fed to an input port of the power divider between a pair of output ports of the power divider;
a pair of amplifiers, each one of the pair of amplifiers having: an amplifier input coupled to a corresponding one of the pair of output ports of the input power divider; and an amplifier output;
a power combiner having: a pair of power combiner input ports and a power combiner output port, each one of the pair of power combiner input ports being coupled to the amplifier output of a corresponding of the pair of amplifiers for combing power at the amplifier output of each one of the pair of amplifiers at the power combiner output port;
wherein signals at the power divider output ports are fed to the amplifier input of the pair of amplifiers in a forward direction and then pass through the amplifiers in the forward direction towards the amplifier output of the pair of amplifiers;
connectors for directing the signals at the output of the pair of amplifiers to the pair of power combiner input ports, the signal then passing through the power combiner to the power combiner output port in a direction opposite to the forward direction; and
wherein the power combiner has a coupling region disposed between the pair of input ports and the output port and wherein the coupling region is vertically disposed over portions of at least one of the pair of amplifiers;
wherein the coupling region and portions of one of the pair of amplifiers are disposed directly over each other; and
wherein the coupling region comprises a pair of vertically overlying conductors separated by a dielectric.

2. A power amplifier structure, comprising:
a power divider for dividing power in a signal fed to an input port of the power divider between a pair of output ports of the power divider;
a pair of amplifiers, each one of the pair of amplifiers having: an amplifier input coupled to a corresponding one of the pair of output ports of the input power divider; and an amplifier output;
a power combiner having: a pair of power combiner input ports and a power combiner output port coupled to the pair of power combiner input ports, each one of the pair of power combiner input ports being coupled to the amplifier output of a corresponding of the pair of amplifiers, for combing power at the amplifier output of each one of the pair of amplifiers at the power combiner output port;
wherein signals at the power divider output ports are fed to the amplifier input of the pair of amplifiers in a forward direction and then pass through the amplifiers in the forward direction towards the amplifier output of the pair of amplifiers;
connectors for directing the signals at the output of the pair of amplifiers to the pair of power combiner input ports, the signal then passing through the power combiner to the power combiner output port in a direction opposite to the forward direction; and
wherein the output port of the power combiner and the pair of amplifiers are disposed at different levels in the structure; and wherein the connectors "fold" the outputs of the amplifiers disposed on one level back "over" the amplifiers to the power combiner on a different level.

3. A power amplifier structure, comprising:

a power divider for dividing power in a signal fed to an input port of the power divider between a pair of output ports of the power divider;

a pair of amplifiers, each one of the pair of amplifiers having: an amplifier input coupled to a corresponding one of the pair of output ports of the input power divider; and an amplifier output;

a power combiner having: a pair of power combiner input ports and a power combiner output, each one of the pair of power combiner input ports being coupled to the amplifier output of a corresponding of the pair of amplifiers, for combing power at the amplifier output of each one of the pair of amplifiers at the power combiner output port;

wherein signals at the power divider output ports are fed to the amplifier input of the pair of amplifiers in a forward direction and then pass through the amplifiers in the forward direction towards the amplifier output of each one of the pair of amplifiers;

connectors for directing the signals at the output of each one of the pair of amplifiers to the pair of power combiner input ports, the signal then passing through the power combiner to the power combiner output port in a direction opposite to the forward direction;

wherein the output ports of the power divider and the output port of the power combiner are disposed in a region on an input port side of the amplifiers and the pair of input port of the power combiner is disposed on a region on an opposing output port side of the amplifiers; and wherein the structure comprises a plurality of vertically stacked layers having formed thereon the power combiner and the power divider and wherein the pair of amplifiers are disposed on a bottom surface of the structure.

4. A power amplifier structure, comprising:

a power divider for dividing power in a signal fed to an input port of the power divider between a pair of output ports of the power divider;

a pair of amplifiers, each one of the pair of amplifiers having: an amplifier input coupled to a corresponding one of the pair of output ports of the input power divider; and an amplifier output;

a power combiner having: a pair of power combiner input ports and a power combiner output port, each one of the pair of power combiner input ports being coupled to the amplifier output of a corresponding of the pair of amplifiers for combing power at the amplifier output of each one of the pair of amplifiers at the power combiner output port;

wherein signals at the power divider output ports are fed to the amplifier input of the pair of amplifiers in a forward direction and then pass through the amplifiers in the forward direction towards the amplifier output of the pair of amplifiers;

connectors for directing the signals at the output of the pair of amplifiers to the pair of power combiner input ports, the signal then passing through the power combiner to the power combiner output port in a direction opposite to the forward direction;

wherein the power combiner has a coupling region disposed between the pair of input ports and the output port and wherein the coupling region is vertically disposed over portions of at least one of the pair of amplifiers; and wherein the structure comprises a plurality of vertically stacked layers having formed thereon the power combiner and the power divider and wherein the pair of amplifiers are disposed on a bottom surface of the structure.

5. A power amplifier structure, comprising:

a power divider for dividing power in a signal fed to an input port of the power divider between a pair of output ports of the power divider;

a pair of amplifiers, each one of the pair of amplifiers having: an amplifier input coupled to a corresponding one of the pair of output ports of the input power divider; and an amplifier output;

a power combiner having: a pair of power combiner input ports and a power combiner output port coupled to the pair of power combiner input ports, each one of the pair of power combiner input ports being coupled to the amplifier output of a corresponding of the pair of amplifiers, for combing power at the amplifier output of each one of the pair of amplifiers at the power combiner output port;

wherein signals at the power divider output ports are fed to the amplifier input of the pair of amplifiers in a forward direction and then pass through the amplifiers in the forward direction towards the amplifier output of the pair of amplifiers;

connectors for directing the signals at the output of the pair of amplifiers to the pair of power combiner input ports, the signal then passing through the power combiner to the power combiner output port in a direction opposite to the forward direction; and wherein the output port of the power combiner is disposed between the pair of output ports of the power divider and the pair of input ports of the power combiner; and wherein the structure comprises a plurality of vertically stacked layers having formed thereon the power combiner and the power divider and wherein the pair of amplifiers are disposed on a bottom surface of the structure.

6. A power amplifier structure, comprising:

a power divider for dividing power in a signal fed to an input port of the power divider between a pair of output ports of the power divider;

a pair of amplifiers, each one of the pair of amplifiers having: an amplifier input coupled to a corresponding one of the pair of output ports of the input power divider; and an amplifier output;

a power combiner having: a pair of power combiner input ports and a power combiner output port coupled to the pair of power combiner input ports, each one of the pair of power combiner input ports being coupled to the amplifier output of a corresponding of the pair of amplifiers, for combing power at the amplifier output of each one of the pair of amplifiers at the power combiner output port;

wherein signals at the power divider output ports are fed to the amplifier input of the pair of amplifiers in a forward direction and then pass through the amplifiers in the forward direction towards the amplifier output of the pair of amplifiers;

connectors for directing the signals at the output of the pair of amplifiers to the pair of power combiner input ports, the signal then passing through the power combiner to the power combiner output port in a direction opposite to the forward direction; and wherein the output port of the power combiner and the pair of amplifiers are disposed at different levels in the structure; and wherein the structure comprises a plurality of vertically stacked layers having formed thereon the power combiner and the power divider and wherein the pair of amplifiers are disposed on a bottom surface of the structure.

7. The amplifier structure recited in claim 3 wherein the connectors "fold" the outputs of the amplifiers disposed on one level back "over" the amplifiers to the power combiner on a different level.

8. The amplifier structure recited in claim 4 wherein the connectors "fold" the outputs of the amplifiers disposed on one level back "over" the amplifiers to the power combiner on a different level.

9. The amplifier structure recited in claim 5 wherein the connectors "fold" the outputs of the amplifiers disposed on one level back "over" the amplifiers to the power combiner on a different level.

* * * * *